United States Patent
Tu et al.

(10) Patent No.: US 10,867,785 B2
(45) Date of Patent: *Dec. 15, 2020

(54) STRUCTURE AND FORMATION METHOD OF SEMICONDUCTOR DEVICE WITH GATE SPACER

(71) Applicant: TAIWAN SEMICONDUCTOR MANUFACTURING CO., LTD., Hsinchu (TW)

(72) Inventors: Guan-Yao Tu, Hsinchu (TW); Yu-Yun Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/739,396

(22) Filed: Jan. 10, 2020

(65) Prior Publication Data
US 2020/0152450 A1  May 14, 2020

Related U.S. Application Data

(63) Continuation of application No. 16/157,589, filed on Oct. 11, 2018, now Pat. No. 10,535,512.

(Continued)

(51) Int. Cl.
*H01L 21/00* (2006.01)
*H01L 21/02* (2006.01)
(Continued)

(52) U.S. Cl.
CPC .... *H01L 21/02208* (2013.01); *H01L 21/0228* (2013.01); *H01L 21/02126* (2013.01);
(Continued)

(58) Field of Classification Search
CPC ......... H01L 21/02208; H01L 21/02274; H01L 21/0228; H01L 29/66553; H01L 29/517;
(Continued)

(56) References Cited

U.S. PATENT DOCUMENTS 7,226,831 B1 * 6/2007 Metz .................. H01L 29/0847
438/216
7,531,437 B2 * 5/2009 Brask .................... H01L 21/845
257/E21.444
(Continued)

*Primary Examiner* — Vu A Vu
(74) *Attorney, Agent, or Firm* — Birch, Stewart, Kolasch & Birch, LLP

(57) ABSTRACT

A structure and a formation method of a semiconductor device structure are provided. The method includes forming a gate stack over a semiconductor substrate and forming a sealing layer over a sidewall of the gate stack using an atomic layer deposition process in a process chamber. The atomic layer deposition process includes alternately and sequentially introducing a first precursor gas and a second precursor gas over the sidewall of the gate stack to form the sealing layer. The second precursor gas has a different atomic concentration of carbon than that of the first precursor gas. The atomic layer deposition process also includes removing a reaction byproduct from the process chamber after the first precursor gas is introduced and before the second precursor gas is introduced. The method also includes partially removing the sealing layer to form a sealing element over the sidewall of the gate stack.

20 Claims, 12 Drawing Sheets

Related U.S. Application Data

(60) Provisional application No. 62/589,231, filed on Nov. 21, 2017.

(51) Int. Cl.
*H01L 29/49* (2006.01)
*H01L 29/51* (2006.01)
*H01L 23/10* (2006.01)
*H01L 29/08* (2006.01)
*H01L 29/66* (2006.01)
*H01L 29/78* (2006.01)

(52) U.S. Cl.
CPC .. *H01L 21/02211* (2013.01); *H01L 21/02219* (2013.01); *H01L 21/02274* (2013.01); *H01L 23/10* (2013.01); *H01L 29/0847* (2013.01); *H01L 29/4966* (2013.01); *H01L 29/517* (2013.01); *H01L 29/66545* (2013.01); *H01L 29/66553* (2013.01); *H01L 29/66795* (2013.01); *H01L 29/7851* (2013.01)

(58) Field of Classification Search
CPC ............... H01L 23/10; H01L 21/02219; H01L 21/02126; H01L 29/4966; H01L 21/02211; H01L 29/7851; H01L 29/0847; H01L 29/66795; H01L 29/66545
USPC .......................................................... 438/778
See application file for complete search history.

(56) References Cited

U.S. PATENT DOCUMENTS

| | | | |
|---|---|---|---|
| 8,450,161 B2* | 5/2013 | Chen ................. | H01L 21/28088 257/344 |
| 8,871,625 B2* | 10/2014 | Ng .................. | H01L 21/823814 257/E21.626 |
| 9,234,276 B2* | 1/2016 | Varadarajan ...... | H01L 21/02222 |
| 10,297,442 B2 | 5/2019 | Varadarajan et al. | |
| 10,535,512 B2* | 1/2020 | Tu ..................... | H01L 21/02208 |
| 2011/0198675 A1* | 8/2011 | Ng ................... | H01L 21/82381 257/288 |
| 2015/0021672 A1* | 1/2015 | Chuang .......... | H01L 21/823821 257/288 |
| 2018/0240664 A9* | 8/2018 | Varadarajan ...... | C23C 16/45523 |

* cited by examiner

STRUCTURE AND FORMATION METHOD OF SEMICONDUCTOR DEVICE WITH GATE SPACER

PRIORITY CLAIM AND CROSS-REFERENCE

This application is a Continuation application of U.S. patent application Ser. No. 16/157,589, filed on Oct. 11, 2018, which claims the benefit of U.S. Provisional Application No. 62/589,231, filed on Nov. 21, 2017, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
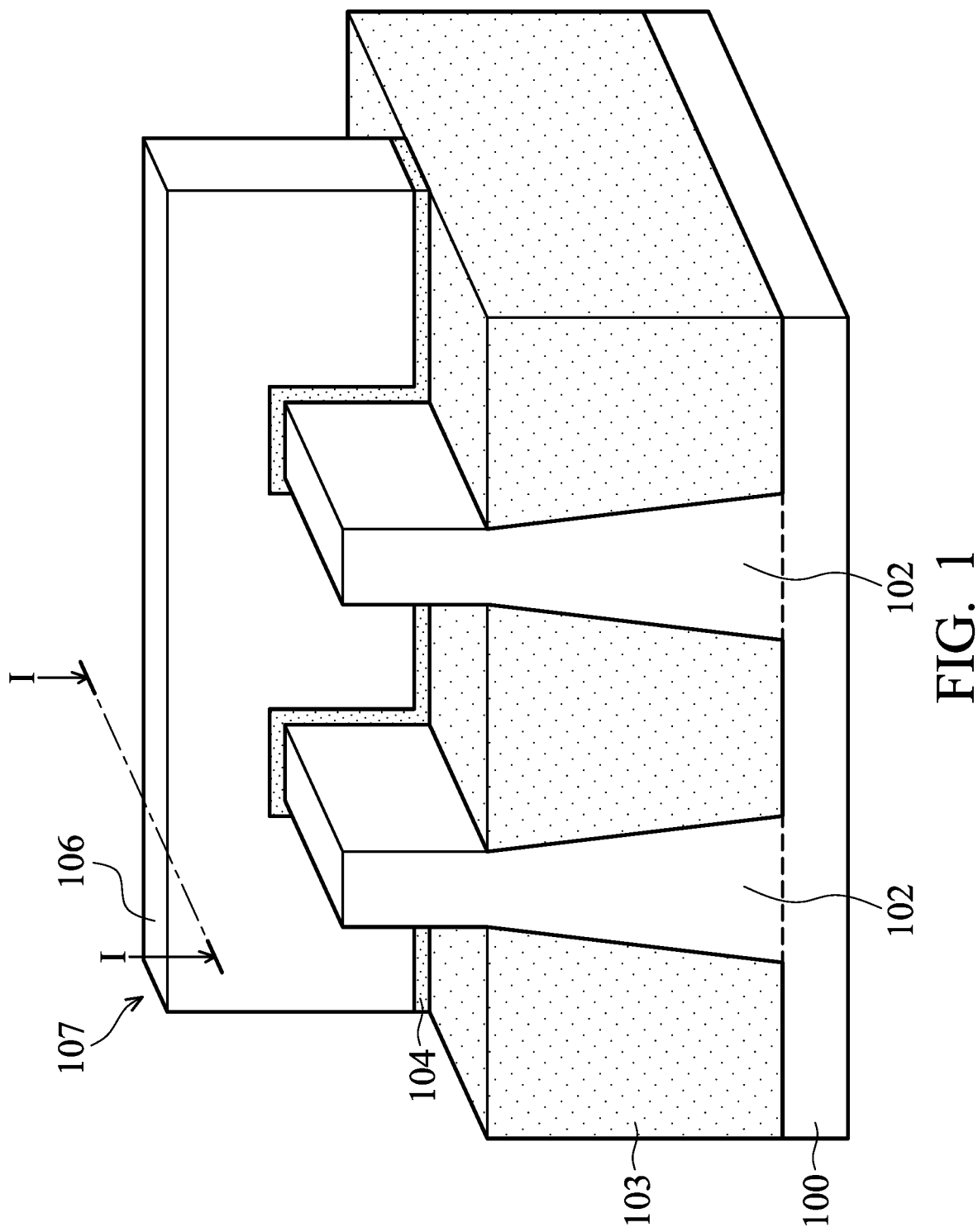
FIG. 1 is a perspective view of an intermediate stage of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to a FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

FIG. 1 is a perspective view of an intermediate stage of a process for forming a semiconductor device structure, in accordance with some embodiments. In some embodiments, FIG. 1 shows an intermediate stage for forming a fin field-effect transistor (FinFET).

Figure 2A:
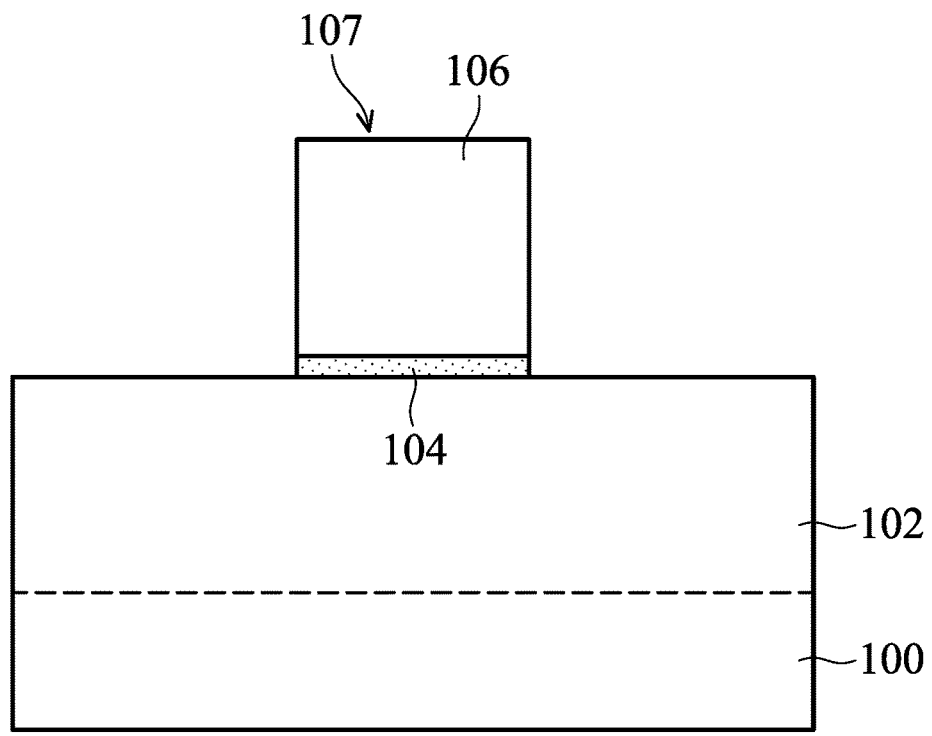
FIGS. 2A-2I are cross-sectional views of various stages of a process for forming a semiconductor device structure, in accordance with some embodiments.

FIGS. 2A-2I are cross-sectional views of various stages of a process for forming a semiconductor device structure, in accordance with some embodiments. In some embodiments, the structure shown in FIG. 2A corresponds to a cross-sectional view taken along the line I-I of FIG. 1. As shown in FIG. 2A, a semiconductor substrate 100 is received or provided.

In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some other embodiments, the semiconductor substrate 100 includes a compound semiconductor. The compound semiconductor may include silicon carbide, gallium arsenide, indium arsenide, indium phosphide, one or more other suitable compound semiconductors, or a combination thereof. In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1, multiple recesses (or trenches) are formed in the semiconductor substrate 100, in accordance with some embodiments. As a result, multiple fin structures 102 are formed or defined between the recesses. In some embodiments, one or more photolithography and etching processes are used to form the recesses. In FIG. 2A, only one of the fin structures 102 is shown. In some embodiments, the fin structures 102 are in direct contact with the semiconductor substrate 100 since the fin structures 102 are originally continuous portions of the semiconductor substrate 100.

However, embodiments of the disclosure have many variations and/or modifications. In some other embodiments, the fin structures 102 are not in direct contact with the semiconductor substrate 100. One or more other material layers may be formed between the semiconductor substrate 100 and the fin structures 102. For example, a dielectric layer may be formed over the semiconductor substrate 100 before the fin structures 102 are formed.

As shown in FIG. 1, isolation features 103 are formed in the recesses to surround lower portions of the fin structures 102, in accordance with some embodiments. The isolation features 103 are used to define and electrically isolate various device elements formed in and/or over the semiconductor substrate 100. In some embodiments, the isolation features 103 include shallow trench isolation (STI) features, local oxidation of silicon (LOCOS) features, another suitable isolation feature, or a combination thereof.

In some embodiments, a dielectric material layer is deposited over the semiconductor substrate 100. The dielectric material layer covers the fin structures 102 and fills the recesses between the fin structures. In some embodiments, the dielectric material layer is deposited using a chemical vapor deposition (CVD) process, an atomic layer deposition (ALD) process, a physical vapor deposition (PVD) process, a spin-on process, one or more other applicable processes, or a combination thereof. In some embodiments, a planarization process is used to thin down the dielectric material layer until the fin structures 102 or hard mask elements defining the fin structures are exposed. The planarization process may include a chemical mechanical polishing (CMP) process, a grinding process, a dry polishing process, an etching process, one or more other applicable processes, or a combination thereof. Afterwards, the dielectric material layer is etched back so that the fin structures 102 protrude from the top surface of the remaining dielectric material layer after the etching process. As a result, the remaining portions of the dielectric material layer form the isolation features 103, as shown in FIG. 1.

Afterwards, a gate stack 107 is formed over the semiconductor substrate 100 to partially cover the fin structures 102, as shown in FIGS. 1 and 2A in accordance with some embodiments. As shown in FIGS. 1 and 2A, the gate stack 107 includes a gate electrode 106 and a gate dielectric layer 104. In some embodiments, the gate stack 107 is a dummy gate stack which may be replaced with another gate stack, such as a metal gate stack.

In some embodiments, a gate dielectric material layer and a gate electrode layer are deposited over the isolation features 103 and the fin structures 102. In some embodiments, the gate dielectric material layer is made of or includes silicon oxide, silicon nitride, silicon oxynitride, dielectric material with a high dielectric constant (high-K), one or more other suitable dielectric materials, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. In some embodiments, the dielectric material layer is a dummy gate dielectric layer which will be removed subsequently. The dummy gate dielectric layer is, for example, a silicon oxide layer.

In some embodiments, the dielectric material layer is deposited using a chemical vapor deposition (CVD) process, an atomic layer deposition (ALD) process, a thermal oxidation process, a physical vapor deposition (PVD) process, one or more other applicable processes, or a combination thereof.

In some embodiments, the gate electrode layer is a dummy gate electrode layer and is made of or includes a semiconductor material such as polysilicon. For example, the dummy gate electrode layer is deposited using a CVD process or another applicable process.

Afterwards, a patterned hard mask element (not shown) is formed over the gate electrode layer, in accordance with some embodiments. The patterned hard mask element is used to pattern the gate electrode layer and the gate dielectric material layer into one or more gate stacks. Afterwards, the gate electrode layer and the gate dielectric material layer are etched with the patterned hard mask element as an etching mask to form the gate stacks including the gate stack 107, as shown in FIGS. 1 and 2A in accordance with some embodiments.

Figure 2B:
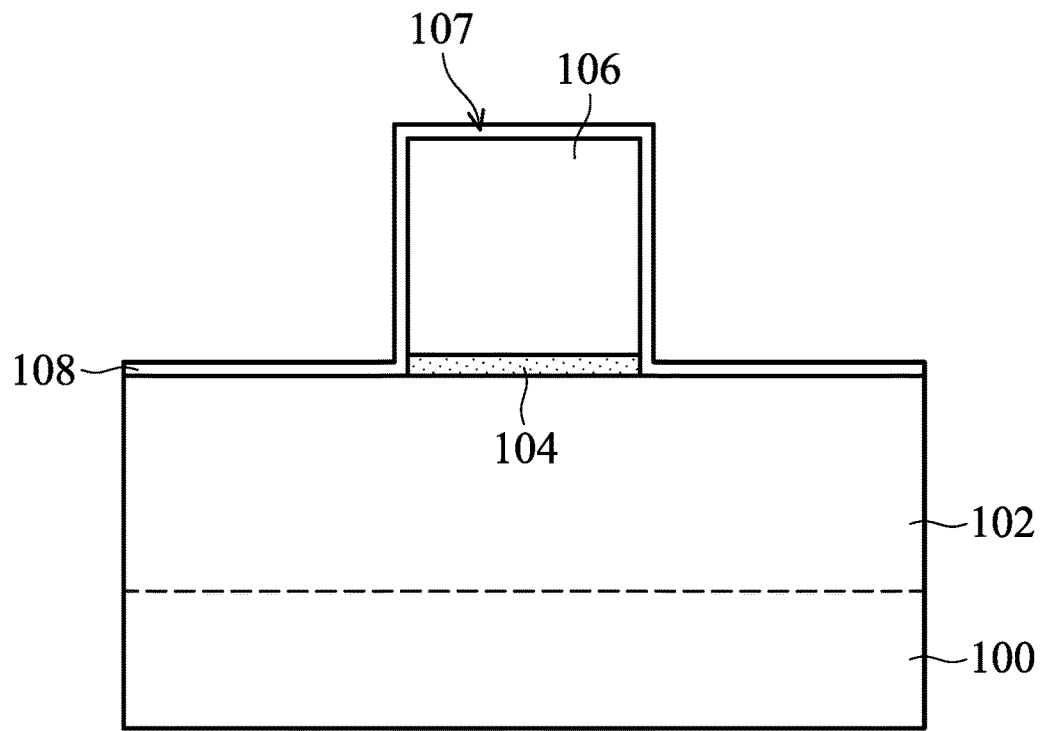

As shown in FIG. 2B, a sealing layer 108 is deposited, in accordance with some embodiments. The sealing layer 108 extends on the fin structure 102 and the top surface and sidewalls of the gate stack 107. The sealing layer 108 may be used to assist in a subsequent ion implantation process for forming lightly-doped source and drain (LDS/D) regions.

In some embodiments, the sealing layer 108 is made of a dielectric material. The dielectric material may include silicon oxycarbonitride, silicon carbide, silicon oxynitride, silicon nitride, silicon oxide, one or more other suitable materials, or a combination thereof. The sealing layer 108 may be deposited using a chemical vapor deposition (CVD) process. In some embodiments, the sealing layer 108 is deposited using an atomic layer deposition (ALD) process. In subsequent processes, the sealing layer 108 may suffer an oxygen-involved etching process and/or a water-involved annealing process. In some embodiments, the sealing layer 108 is formed to have strong oxidation-resistance terminal ligand. The sealing layer 108 may be prevented from being oxidized and/or being inserted water. Therefore, the sealing layer 108 may have a low dielectric constant. As the density of semiconductor devices increases and the size of circuit elements becomes smaller, the resistance capacitance (RC) delay time increasingly dominates circuit performance. To keep the sealing layer 108 having a low dielectric constant may help to improve the performance of the semiconductor device.

In some embodiments, two or more silicon-containing precursors are sequentially and alternatively used in the same process chamber for performing an ALD process to form the sealing layer 108. One of the silicon-containing precursors may contribute the formed sealing layer 108 strong oxidation-resistance terminal ligands. Another silicon-containing precursor may allow the formed sealing layer 108 to have a lower dielectric constant. Therefore, the sealing layer 108 may have a low dielectric constant and a high resistance to the subsequent oxygen-involved etching process and/or water-involved annealing process.

Figure 3:
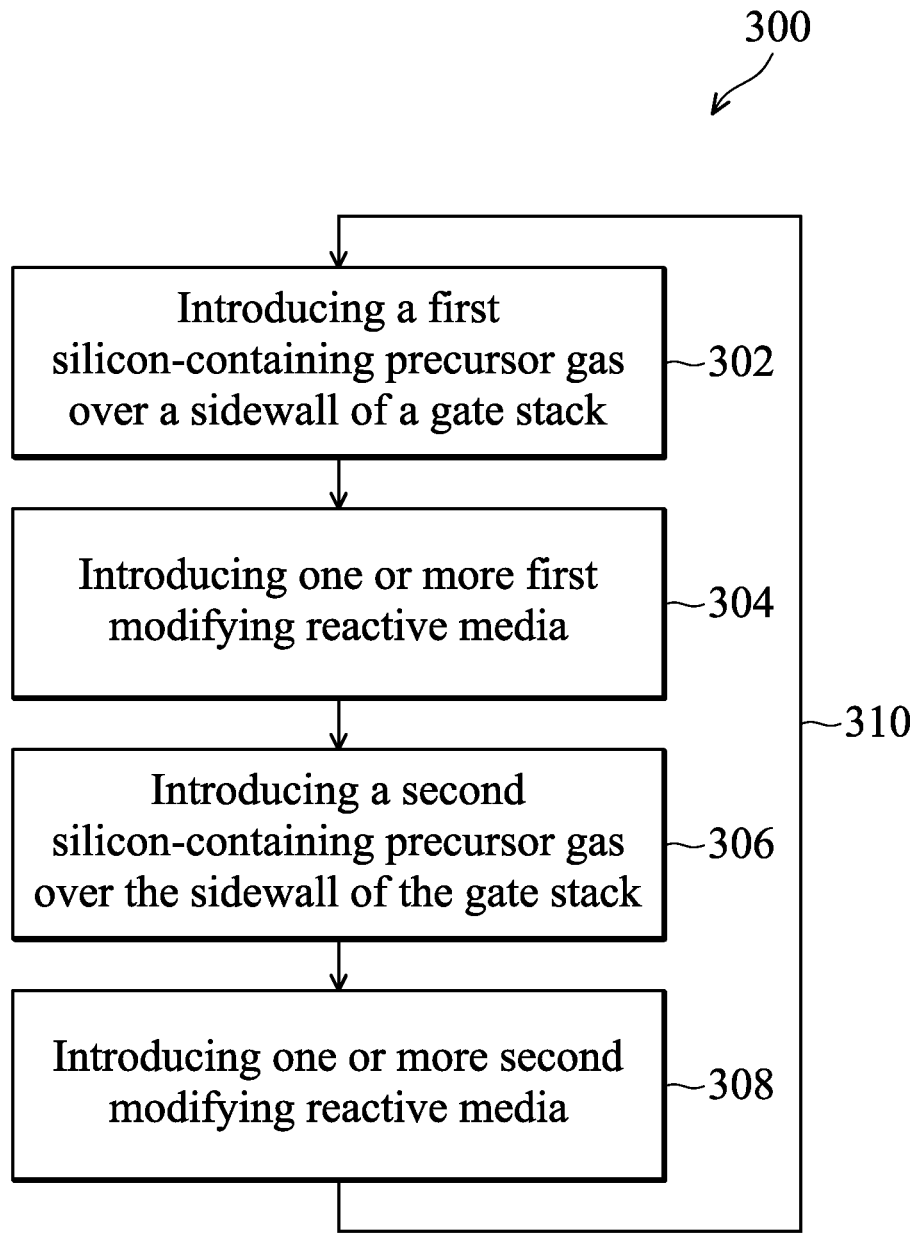
FIG. 3 is a flow chart of a method for forming a material layer using an atomic layer deposition process, in accordance with some embodiments.
Figure 7:
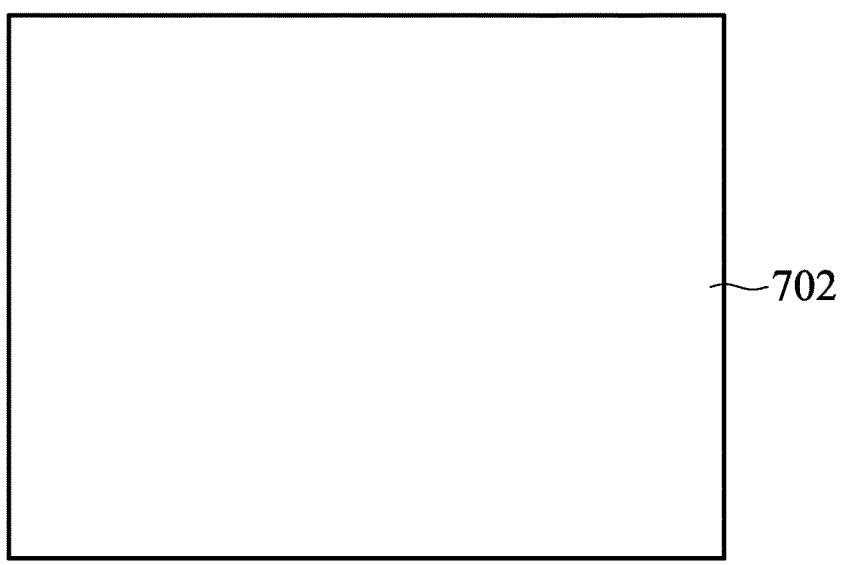
FIG. 7 shows a process chamber for performing an atomic layer deposition process, in accordance with some embodiments.

FIG. 3 is a flow chart of a method 300 for forming a material layer using an atomic layer deposition process, in accordance with some embodiments. In some embodiments, the method 300 is used to form the sealing layer 108. FIG. 7 shows a process chamber 702 for performing an atomic layer deposition process, in accordance with some embodiments. In some embodiments, the structure shown in FIG. 2A is transferred into the process chamber 702 for forming the sealing layer 108 by the method 300. In some embodiments, a first silicon-containing precursor gas and a second silicon-containing precursor gas are alternatively and sequentially introduced into the process chamber 702 to form the sealing layer 108.

In some embodiments, the method 300 includes an operation 302 in which a first silicon-containing precursor gas is introduced over the sidewall of the gate stack 107. In some embodiments, the first silicon-containing precursor gas is also applied on the top surface of the gate stack 107, the exposed surfaces of the fin structures 102, and/or the top surfaces of the isolation features 103. In some embodiments, the first silicon-containing precursor gas includes a silicon-halogen bonding (such as a silicon-chlorine bonding or a silicon-bromine bonding), a silicon-nitrogen bonding, a silicon-hydrogen bonding, or a combination thereof. For example, the first silicon-containing precursor gas may be or include silicon chloride, silicon bromide, silicon iodide, silane, amino group containing silane, one or more other suitable or similar compounds, or a combination thereof. In some other embodiments, the first silicon-containing precursor gas further includes a silicon-carbon bonding.

The first silicon-containing precursor gas may react with the surface of a material one at a time in a sequential, self-limiting, manner. The precursor molecules may react with the surface of the gate stack 107 in a self-limiting way, so that the reaction terminates once the reactive sites on the surface of the gate stack 107 are consumed. In some embodiments, a sufficient reaction time is provided to ensure that all or almost all the reactive sites on the surface of the gate stack 107 react with the precursor molecules and are consumed. The silicon-containing species from the first silicon-containing precursor gas may be adsorbed onto the surface of the gate stack 107 to form an atomic layer.

Figure 9A:
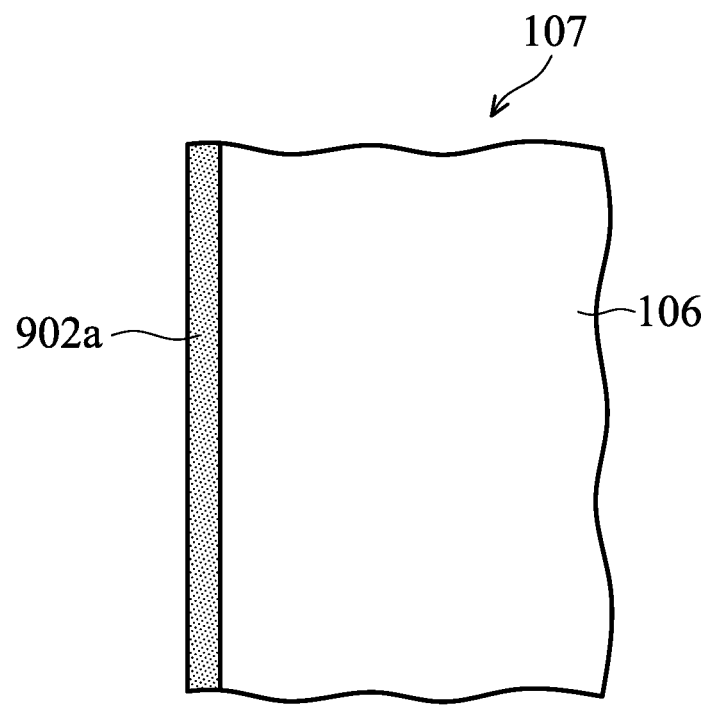
FIGS. 9A-9C are cross-sectional views of various stages of a process for forming a semiconductor device structure, in accordance with some embodiments.
Figure 9B:
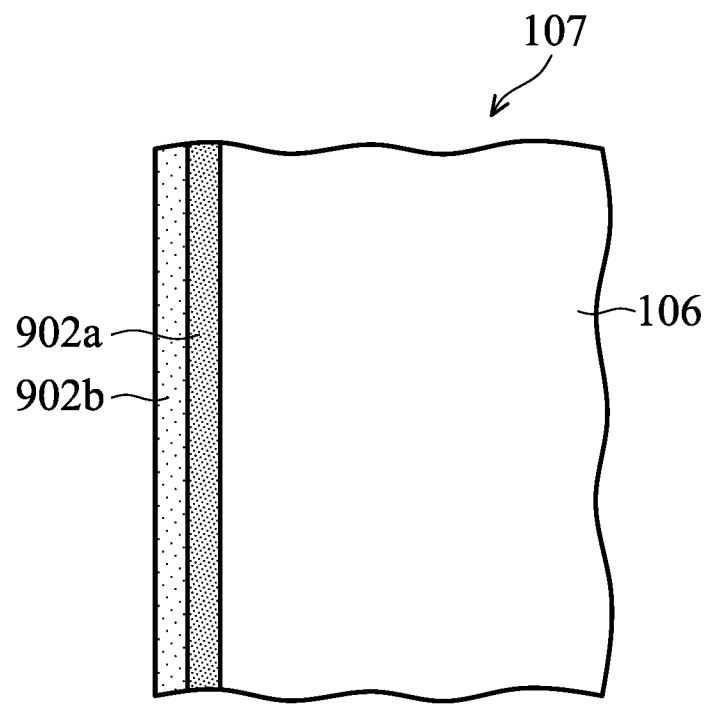
Figure 9C:
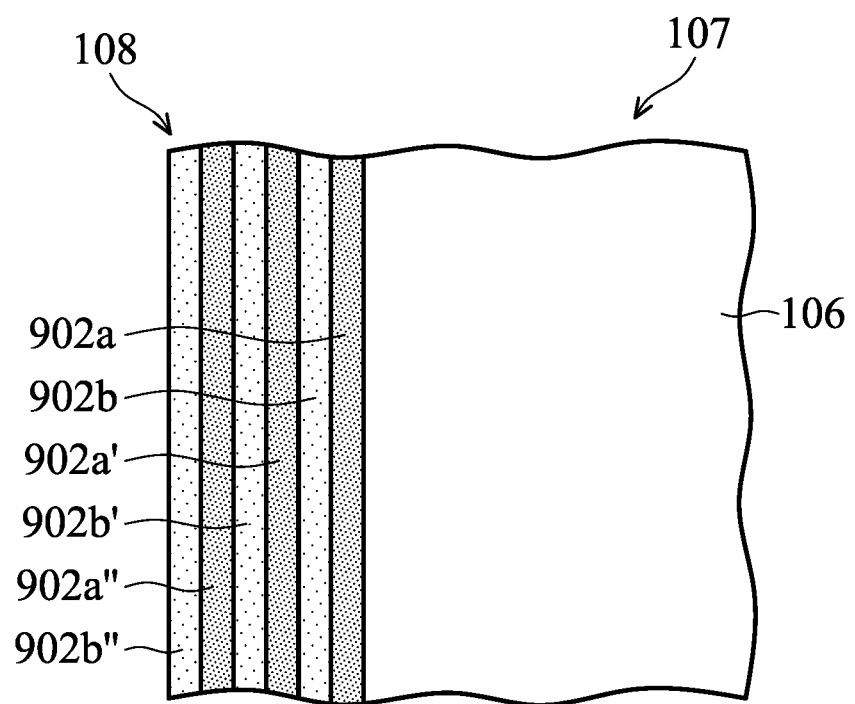

FIGS. 9A-9C are cross-sectional views of a process for forming a semiconductor device structure, in accordance with some embodiments. In some embodiments, FIG. 9A is an enlarged cross-sectional view of the structure shown in FIG. 2B. In some embodiments, silicon-containing species from the first silicon-containing precursor gas are adsorbed onto the surface of the gate stack 107 to form an atomic layer 902a. In some embodiments, the first silicon-containing precursor gas is substantially free of carbon. Therefore, the atomic layer 902a is substantially free of carbon, in accordance with some embodiments. Once the reactive sites are completely or almost completely consumed, the growth of the atomic layer 902a automatically terminates. The thickness of the atomic layer 902a may be a few angstroms. For example, the thickness of the atomic layer 902a is in a range from about 2 Å to about 10 Å. The excess portion of the first silicon-containing precursor gas would not chemically bond with the surface of the atomic layer 902a after the reactive sites are consumed. In some embodiments, the excess portion of the first silicon-containing precursor gas and/or reaction byproducts are/is then removed from the process chamber 702 by introducing a purge gas such as argon gas.

In some embodiments, the method 300 continues with an operation 304 in which one or more first modifying reactive media are introduced onto the atomic layer formed in the operation 302. For example, the one or more first modifying reactive media are introduced onto the atomic layer 902a shown in FIG. 9A. In some embodiments, the introduction of the one or more first modifying reactive media includes introducing an oxygen-containing media, introducing a nitrogen-containing media, and introducing a carbon-containing media. After multiple modification operations, the atomic layer 902a is modified to include reactive sites capable of reacting with subsequently introduced precursor gas, which allows an atomic layer to be formed directly on the atomic layer 902a later.

In some embodiments, an oxygen-containing media is introduced into the process chamber 702 to modify the atomic layer (such as the atomic layer 902a shown in FIG. 9A) formed in the operation 302. The oxygen-containing media may include oxygen gas, oxygen-containing plasma, ozone, or the like. The oxygen-containing media may react with the surface of the atomic layer 902a in a self-limiting way, so that the reaction terminates once the reactive sites are consumed. After the modification of the oxygen-containing media, the atomic layer 902a is modified to include a silicon-oxygen (Si—O) bonding. For example, the surface of the atomic layer 902a includes a silicon-halogen bonding, and the silicon-halogen bonding may react with the oxygen-containing media to become the silicon-oxygen bonding. After the reaction terminates once the reactive sites are consumed, the excess portion of the oxygen-containing media and/or reaction byproducts are then removed from the process chamber 702, in accordance with some embodiments. The excess portion of the oxygen-containing media and/or reaction byproducts may be removed by introducing a purge gas such as argon gas.

Many variations and/or modifications can be made to embodiments of the disclosure. In some other embodiments, the oxygen-containing media is not used.

In some embodiments, a nitrogen-containing media is then introduced into the process chamber 702 to modify the atomic layer 902a. The nitrogen-containing media may include nitrogen gas, nitrogen-containing plasma, or the like. The nitrogen-containing media may react with the surface of the oxygen-modified atomic layer 902a in a self-limiting way, so that the reaction terminates once the reactive sites are consumed. After the modification of the nitrogen-containing media, the atomic layer 902a is modified to include a silicon-nitrogen (Si—N) bonding. After the reaction terminates once the reactive sites are consumed, the excess portion of the nitrogen-containing media and/or reaction byproducts are then removed from the process chamber 702, in accordance with some embodiments. The excess portion of the nitrogen-containing media and/or reaction byproducts may be removed by introducing a purge gas such as argon gas.

Many variations and/or modifications can be made to embodiments of the disclosure. In some other embodiments, the nitrogen-containing media is not used.

In some embodiments, a carbon-containing media is then introduced into the process chamber 702 to modify the atomic layer 902a. The carbon-containing media may include methane, propane, ethane, or the like. The carbon-containing media may react with the surface of the nitrogen-modified atomic layer 902a in a self-limiting way, so that the reaction terminates once the reactive sites are consumed. After the modification of the carbon-containing media, the atomic layer 902a may be modified to include a nitrogen-carbon (N—C) bonding. After the reaction terminates once the reactive sites are consumed, the excess portion of the carbon-containing media and/or reaction byproducts are then removed from the process chamber 702, in accordance with some embodiments. The excess portion of the carbon-containing media and/or reaction byproducts may be removed by introducing a purge gas such as argon gas.

Many variations and/or modifications can be made to embodiments of the disclosure. The introducing order of the oxygen-containing media, the nitrogen-containing media, and the carbon-containing media may be varied. In some other embodiments, the carbon-containing media is not used. In some other embodiments, no modifying reactive media is used.

In some embodiments, the method 300 continues with an operation 306 in which a second silicon-containing precursor gas is introduced over the sidewall of the gate stack 107. In some embodiments, the second silicon-containing precursor gas is also applied over the top surface of the gate stack 107, the fin structures 102, and/or the top surfaces of the isolation features 103. In some embodiments, the second silicon-containing precursor gas includes a silicon-halogen bonding (such as a silicon-chlorine bonding or a silicon-bromine bonding), a silicon-nitrogen bonding, a silicon-hydrogen bonding, or a combination thereof. For example, the second silicon-containing precursor gas may be or include silicon chloride, silicon bromide, silicon iodide, silane, amino group containing silane, one or more other suitable or similar compounds, or a combination thereof. In some other embodiments, the second silicon-containing precursor gas further includes a silicon-carbon (Si—C) bonding.

In some embodiments, the second silicon-containing precursor gas has a different atomic concentration of carbon than that of the first silicon-containing gas. In some embodiments, the second silicon-containing precursor gas has a greater atomic concentration of carbon than that of the first silicon-containing gas. In some embodiments, the first silicon-containing precursor gas substantially contains no carbon, and the second silicon-containing precursor gas includes a silicon-carbon bonding.

Many variations and/or modifications can be made to embodiments of the disclosure. In some other embodiments, the first silicon-containing precursor gas has a greater atomic concentration of carbon than that of the second silicon-containing gas. In some other embodiments, the second silicon-containing gas is substantially free of carbon, and the first silicon-containing gas includes a silicon-carbon bonding.

In the operation 306, the second silicon-containing precursor gas may react with the surface of the modified atomic layer 902a in a self-limiting way, so that the reaction terminates once the reactive sites on the surface of the modified atomic layer 902a are consumed. The silicon-containing species from the second silicon-containing precursor gas may be adsorbed onto the surface of the modified atomic layer 902b.

In some embodiments, silicon-containing species from the second silicon-containing precursor gas are adsorbed onto the surface of the atomic layer 902a to form an atomic layer 902b, as shown in FIG. 9B. In some embodiments, the second silicon-containing precursor gas includes a silicon-carbon bonding. Therefore, the atomic layer 902b contains carbon, in accordance with some embodiments. In some embodiments, the atomic layer 902b includes a silicon-carbon bonding. Once the reactive sites are completely or almost completely consumed, the growth of the atomic layer 902b automatically terminates. The thickness of the atomic layer 902b may be a few angstroms. For example, the thickness of the atomic layer 902b is in a range from about 2 Å to about 10 Å. The excess portion of the second silicon-containing precursor gas would not chemically bond with the surface of the atomic layer 902b after the reactive sites are consumed. In some embodiments, the excess portion of the second silicon-containing precursor gas and/or reaction byproducts are/is then removed from the process chamber 702. The excess portion of the second silicon-containing precursor gas and/or reaction byproducts may be removed by introducing a purge gas such as argon gas.

In some embodiments, the method 300 continues with an operation 308 in which one or more second modifying reactive media are introduced onto the atomic layer 902b formed in the operation 306. In some embodiments, the introduction of the one or more second modifying reactive media includes introducing an oxygen-containing media, introducing a nitrogen-containing media, and introducing a carbon-containing media. After multiple modification operations, the atomic layer 902b is modified to include reactive sites capable of reacting with subsequently introduced precursor gas, which allows an atomic layer to be formed directly on the atomic layer 902b later.

In some embodiments, an oxygen-containing media is introduced into the process chamber 702 to modify the atomic layer formed in the operation 306. The oxygen-containing media may include oxygen gas, oxygen-containing plasma, ozone, or the like. The oxygen-containing media may react with the surface of the atomic layer in a self-limiting way, so that the reaction terminates once the reactive sites are consumed. After the modification of the oxygen-containing media, the atomic layer is modified to include a silicon-oxygen bonding. For example, the surface of the atomic layer 902b includes a silicon-halogen bonding, and the silicon-halogen bonding provided from the second silicon-containing precursor gas may react with the oxygen-containing media to become the silicon-oxygen bonding. After the reaction terminates once the reactive sites are consumed, the excess portion of the oxygen-containing media and/or reaction byproducts are then removed from the process chamber 702, in accordance with some embodiments. The excess portion of the oxygen-containing media and/or reaction byproducts may be removed by introducing a purge gas such as argon gas.

Many variations and/or modifications can be made to embodiments of the disclosure. In some other embodiments, the oxygen-containing media is not used.

In some embodiments, a nitrogen-containing media is then introduced into the process chamber 702 to modify the atomic layer 902b. The nitrogen-containing media may include nitrogen gas, nitrogen-containing plasma, or the like. The nitrogen-containing media may react with the surface of the oxygen-modified atomic layer 902b in a self-limiting way, so that the reaction terminates once the reactive sites are consumed. After the modification of the nitrogen-containing media, the atomic layer 902b is modified to include a silicon-nitrogen bonding. After the reaction terminates once the reactive sites are consumed, the excess portion of the nitrogen-containing media and/or reaction byproducts are then removed from the process chamber 702, in accordance with some embodiments. The excess portion of the nitrogen-containing media and/or reaction byproducts may be removed by introducing a purge gas such as argon gas.

Many variations and/or modifications can be made to embodiments of the disclosure. In some other embodiments, the nitrogen-containing media is not used.

In some embodiments, a carbon-containing media is then introduced into the process chamber 702 to modify the atomic layer 902b. The carbon-containing media may include propane, methane, ethane, or the like. The carbon-containing media may react with the surface of the nitrogen-modified atomic layer 902b in a self-limiting way, so that the reaction terminates once the reactive sites are consumed. After the modification of the carbon-containing media, the atomic layer 902b may be modified to include a nitrogen-carbon bonding. After the reaction terminates once the reactive sites are consumed, the excess portion of the carbon-containing media and/or reaction byproducts are then removed from the process chamber 702, in accordance with some embodiments. The excess portion of the carbon-containing media and/or reaction byproducts may be removed by introducing a purge gas such as argon gas.

Many variations and/or modifications can be made to embodiments of the disclosure. The introducing order of the oxygen-containing media, the nitrogen-containing media, and the carbon-containing media may be varied. In some other embodiments, the carbon-containing media is not used. In some other embodiments, no modifying reactive media is used.

In some embodiments, the method 300 continues with an operation 310 in which the deposition cycle from the operation 302 to the operation 308 is repeated two or more times to form more atomic layers. In some embodiments, atomic layers 902a', 902b', 902a", and 902b" are formed, as shown in FIG. 9C. In some embodiments, the atomic layers 902a' and 902a" are formed using the first silicon-containing precursor gas, and the atomic layers 902b' and 902b" are formed using the second silicon-containing precursor gas. The deposition cycle may be repeated more times to form more atomic layers. As a result, these atomic layers together form the sealing layer 108 with a desired thickness, as shown in FIGS. 9C and 2B. The thickness of the sealing layer 108 may be in a range from about 2 nm to about 20 nm. In some embodiments, the sealing layer 108 contains silicon, oxygen, carbon, and nitrogen. In some embodiments, the sealing layer 108 is a SiOCN film.

In some embodiments, the second silicon-containing precursor gas has a greater atomic concentration of carbon than that of the first silicon-containing precursor gas. Therefore, the atomic layer (such as the atomic layers 902b, 902b', and 902b") formed using the second silicon-containing gas has a greater atomic concentration of carbon than that of the atomic layer (such as the atomic layers 902a, 902a', and 902a") formed using the first silicon-containing precursor gas. Due to the greater atomic concentration of carbon, the atomic layers 902b, 902b' and 902b" may have a lower dielectric constant than that of the atomic layers 902a, 902a', and 902a". The second silicon-containing precursor gas may allow the formed sealing layer 108 to include a Si—C bond and have a low dielectric constant. The dielectric constant of the sealing layer 108 may be in a range from about 1.5 to about 3.5.

However, in some cases, if a sealing layer is formed using the second silicon-containing precursor gas without using the first silicon-containing precursor gas, the obtained sealing layer may tend to be oxidized by a subsequent water-involved annealing process and/or damaged by an oxygen-based etching process. Moisture may be inserted into the obtained sealing layer, which may result in a high dielectric constant of the obtained sealing layer.

In some embodiments, the first silicon-containing precursor gas has a lower atomic concentration of carbon than that of the second silicon-containing precursor gas. In some embodiments, the first silicon-containing precursor gas is substantially free of carbon. Therefore, the atomic layer (such as the atomic layers 902a, 902a', and 902a") formed using the first silicon-containing gas has a greater dielectric constant than that of the atomic layer (such as the atomic layers 902b, 902b' and 902b") formed using the second silicon-containing precursor gas. Although the atomic layers 902a, 902a' and 902a" may have a greater dielectric constant than that of the atomic layers 902b, 902b' and 902b", the atomic layers 902a, 902a' and 902a" that have lower atomic concentration of carbon (or is substantially free of carbon) have better oxidation resistance than the atomic layers 902b, 902b' and 902b". The atomic layers 902a, 902a', and 902a" may be used to prevent or reduce the oxidation of the atomic layer 902b. Moisture may be prevented from being inserted into the sealing layer 108 to increase the overall dielectric constant. The first silicon-containing precursor gas may allow the formed sealing layer 108 to have high resistance to the subsequent oxygen-involved etching process and/or water-involved annealing process. Therefore, the combination of the atomic layers 902a, 902a', and 902a" and the atomic layers 902b, 902b' and 902b" may allow the formed sealing layer 108 to have a low dielectric constant and good oxidation resistance to sustain subsequent processes. The dielectric constant of the sealing layer 108 is prevented from being decreased after the subsequent processes.

Figure 2C:
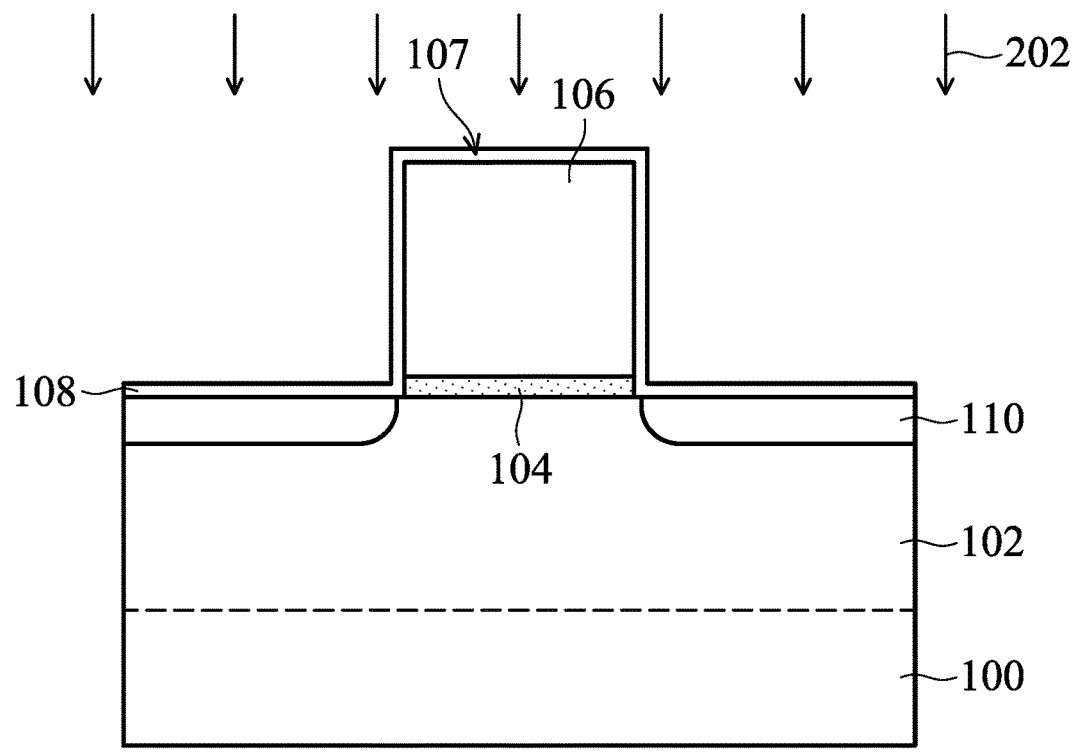

As shown in FIG. 2C, lightly doped source and drain (LDS/D) regions 110 are formed in the fin structure 102, in accordance with some embodiments. The LDS/D regions 110 are formed on opposite sides of the gate stack 107. In some embodiments, an ion implantation process 202 is used to form the LDS/D regions 110. The sealing layer 108 may help to determine the edges of the formed LDS/D regions 110. In some embodiments, the implantation process 202 is performed at a tilt angle such that the formed LDS/D regions 110 extend towards the bottom of the gate stack 107.

Figure 2D:
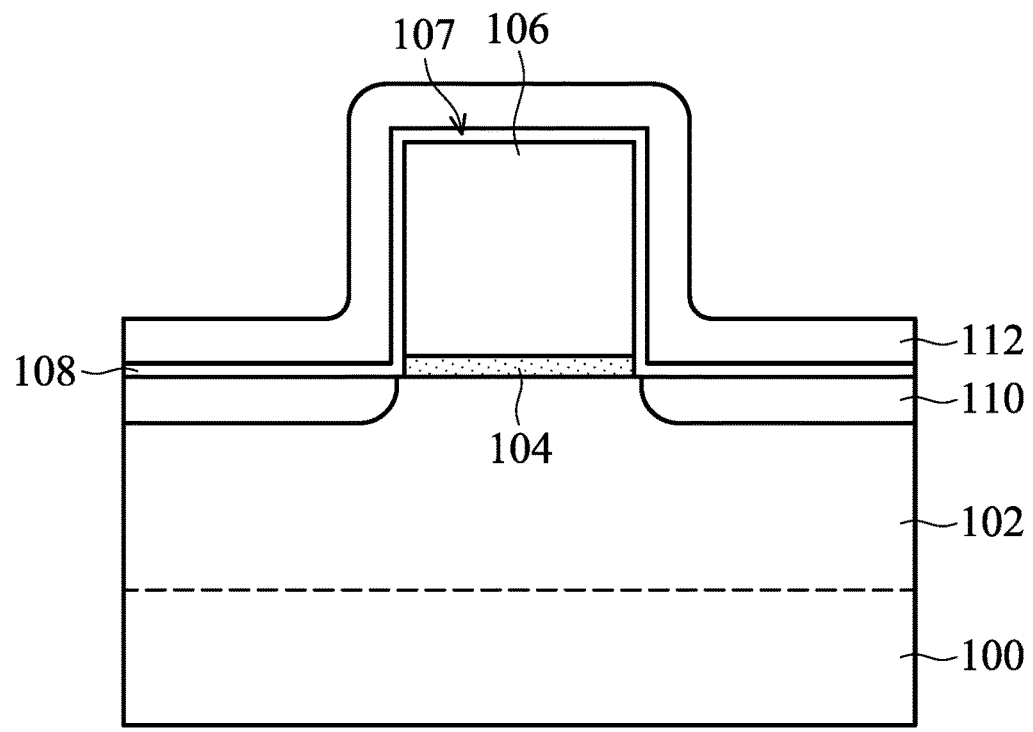

As shown in FIG. 2D, a spacer layer 112 is deposited over the sealing layer 108, in accordance with some embodiments. The spacer layer 112 also extends along the sidewalls and top surfaces of the gate stack 107. In some embodiments, the spacer layer 112 is thicker than the sealing layer 108. In some embodiments, the spacer layer 112 and the sealing layer 108 are made of the same material. In some other embodiments, the spacer layer 112 and the sealing layer 108 are made of different materials.

In some embodiments, the spacer layer 112 is made of a dielectric material. The dielectric material may include silicon oxycarbonitride, silicon carbide, silicon oxynitride, silicon nitride, silicon oxide, one or more other suitable materials, or a combination thereof. The spacer layer 112 may be deposited using a chemical vapor deposition (CVD) process. In some embodiments, the spacer layer 112 is deposited using an ALD process. In subsequent processes, the spacer layer 112 may suffer an oxygen-involved etching process and/or a water-involved annealing process. In some embodiments, the spacer layer 112 is formed to have strong oxidation-resistance terminal ligand.

In some embodiments, two precursor gases are alternatively and sequentially used to form the spacer layer 112. One of the precursor gases may be used to provide the spacer layer 112 with the strong oxidation-resistance terminal ligand. Another precursor gas may be used to provide the spacer layer 122 with a carbon-containing bonding (such as a Si—C bonding), which may result in a low dielectric constant. Therefore, the spacer layer 112 may be prevented from being oxidized and still have a relatively low dielectric constant. For example, the spacer layer 112 has a lower dielectric constant than that of silicon dioxide.

In some embodiments, the spacer layer 112 is formed using a similar or the same ALD process used for forming the sealing layer 108. In some embodiments, a third silicon-containing precursor gas and a fourth silicon-containing precursor gas are alternately and sequentially introduced into the same process chamber (i.e., the process chamber 702) to form the spacer layer 112. The method 300 illustrated in FIG. 3 may be used to form the spacer layer 112. In some embodiments, the first silicon-containing precursor gas and the third silicon-containing precursor gas have the same composition. In some embodiments, the second silicon-containing precursor gas and the fourth silicon-containing precursor gas have the same composition. In some embodiments, the spacer layer 112 is thicker than the sealing layer 108. The thickness of the spacer layer 112 may be in a range from about 4 nm to about 40 nm. The thickness of the sealing layer 108 may be in a range from about 2 nm to about 20 nm. In some embodiments, the deposition cycle from the operation 302 to the operation 308 is repeated multiple times to form multiple atomic layers. As a result, these atomic layers together form the spacer layer 112 with the desired thickness.

Figure 2E:
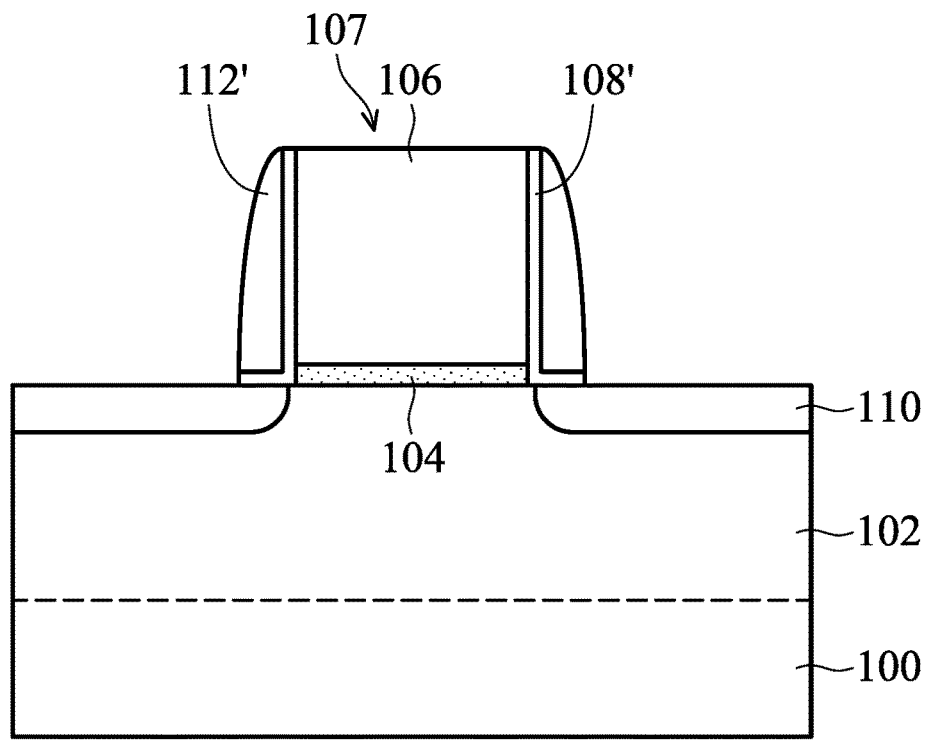

As shown in FIG. 2E, the spacer layer 112 and the sealing layer 108 are partially removed to form sealing elements 108' and spacer elements 112', in accordance with some embodiments. In some embodiments, an anisotropic etching is used to partially remove the spacer layer 112 and the sealing layer 108. As a result, the remaining portions of the spacer layer 112 and the sealing layer 108 form the spacer elements 112' and the sealing elements 108'. In some embodiments, each or one of the spacer elements 112' gradually shrinks along a direction extending from the bottom towards the top of the gate stack 107. In some embodiments, each or one of the sealing elements 108' has an L-shape profile. After the formation of the spacer element 112' and the sealing element 108', portions of the fin structure 102 including portions of the LDS/D regions 110 are exposed, as shown in FIG. 2E.

Figure 2F:
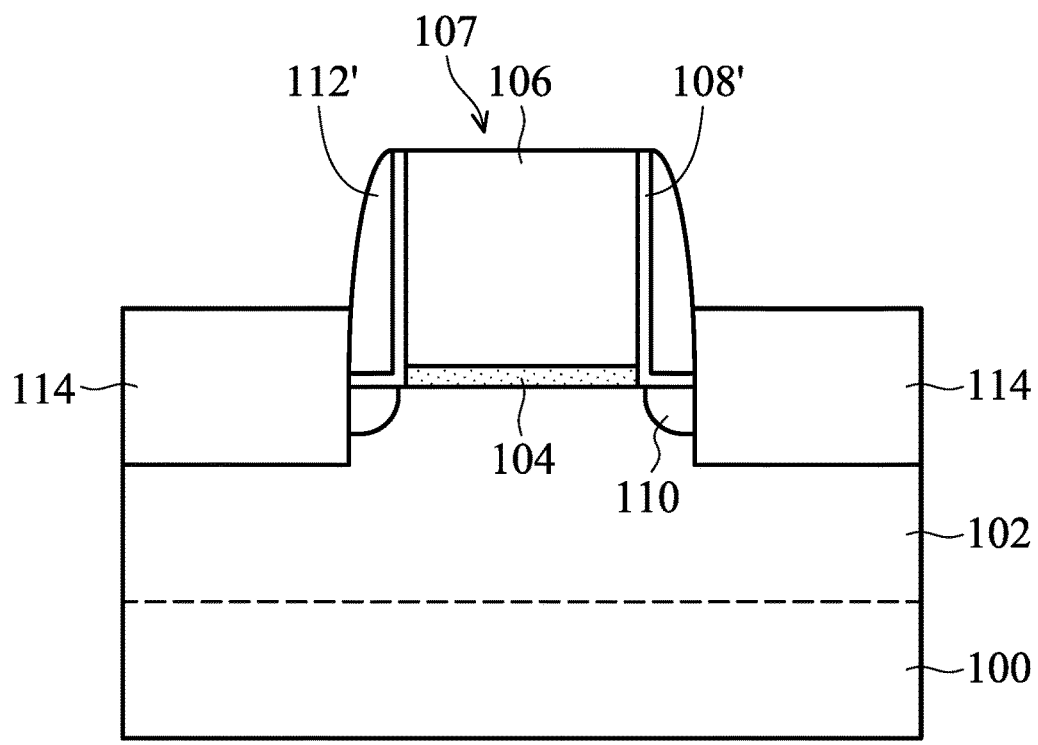

As shown in FIG. 2F, the fin structure 102 is partially removed to form a recess, in accordance with some embodiments. In some embodiments, a portion of the fin structure 102 is recessed to be lower than the top surfaces of the isolation features 103 shown in FIG. 1. In some embodiments, an etching process is performed to remove an upper portion of the fin structure 102. As a result, the recesses are formed. In some other embodiments, multiple etching operations are used so that the recesses further extend laterally towards channel regions below the gate stack 107. During the etching process, the LDS/D regions 110 may also be partially removed. As shown in FIG. 2F, the remaining portions of the LDS/D regions 110 are positioned between the sidewalls of the recesses and the channel region under the gate stack 107.

Afterwards, source/drain structures 114 are formed to fill or overfill the recesses, as shown in FIG. 2F in accordance with some embodiments. In some embodiments, the source/drain structures 114 protrude from the top surfaces of the isolation features 103 shown in FIG. 1. In some embodiments, a semiconductor material (or two or more semiconductor materials) is epitaxially grown over the fin structure 102 that is recessed to fill or overfill the recesses, growing continually to above the recesses, to form the source/drain structures 114.

In some embodiments, the source/drain structures 114 are made of a p-type semiconductor material. For example, the source/drain structures 114 may include epitaxially grown silicon germanium. The source/drain structures 114 are not limited to being made of a p-type semiconductor material. In some embodiments, the source/drain structures 114 are made of an n-type semiconductor material. The source/drain structures 114 may include epitaxially grown silicon, epitaxially grown silicon carbide (SiC), epitaxially grown silicon phosphide (SiP), or another suitable epitaxially grown semiconductor material.

In some embodiments, the source/drain structures 114 are formed using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof. The formation process of the source/drain structures 114 may use gaseous and/or liquid precursors.

In some embodiments, the source/drain structures 114 include dopants. In some embodiments, the source/drain structures 114 are doped in-situ during the growth of the source/drain structures 114. In some other embodiments, the source/drain structures 114 are not doped during the growth of the source/drain structures 114. After the epitaxial growth, the source/drain structures 114 are doped in a subsequent process. In some embodiments, the doping is achieved using an ion implantation process, a plasma immersion ion implantation process, a gas and/or solid source diffusion process, one or more other applicable processes, or a combination thereof. In some embodiments, the source/drain structures 114 are further exposed to one or more annealing processes to activate the dopants. For example, a rapid thermal annealing process is used.

Figure 2G:
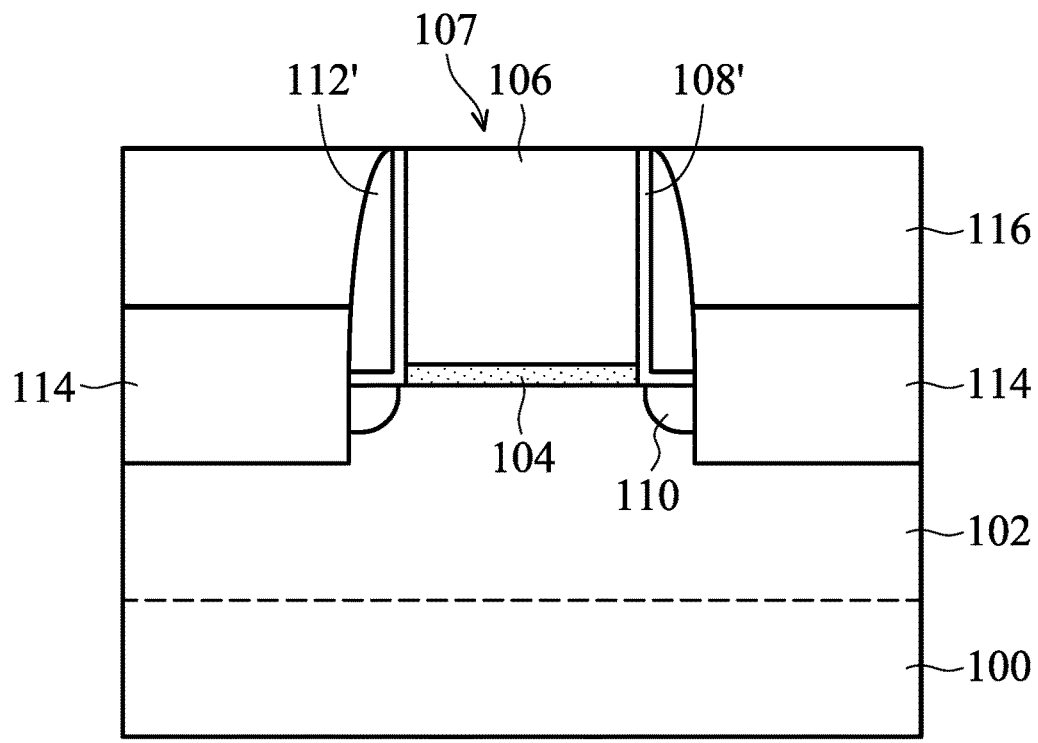

As shown in FIG. 2G, a dielectric layer 116 is formed over the fin structure 102, the source/drain structures 114, and the isolation features 103 (shown in FIG. 1) to surround the gate stack 107, in accordance with some embodiments. In some embodiments, the dielectric layer 116 is made of or includes silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable dielectric materials, or a combination thereof. In some embodiments, the dielectric layer 116 is deposited using a CVD process, an ALD process, a PVD process, a spin-on process, one or more other applicable processes, or a combination thereof.

In some embodiments, a flowable chemical vapor deposition (FCVD) process is used to form the dielectric layer 116. In some embodiments, the dielectric layer 116 is formed of flowable silicon dioxide ($SiO_2$). In the FCVD process, a silicon-containing precursor (e.g., an organic silane) may react with an oxygen-containing precursor (e.g. one or more of oxygen, ozone, and nitrogen oxides) to form the dielectric layer 116. The dielectric layer 116 may have a substantially high concentration of silicon-hydroxide (Si—OH) bonds. The bonds may promote and/or optimize the flowability (or mobility) of silicon oxide material of the dielectric layer 116. Therefore, the silicon oxide material may rapidly move into gaps and/or trenches on the semiconductor substrate 100 and/or on the elements already positioned on the semiconductor substrate 100.

In some embodiments, the formation of the dielectric layer 116 involves a curing process. The curing process may involve exposing the flowable dielectric material to an oxygen-containing media such as deionized water and/or ozone ($O_3$). The sealing element 108' and/or the spacer element 112' may have high resistance to the oxygen-containing media. The water is prevented from inserting into the sealing element 108' and/or the spacer element 112'. The sealing element 108' and/or the spacer element 112' may still have a low dielectric constant.

In the curing process, the flow rate of ozone may be in a range from about 100 sccm to about 5000 sccm, the process temperature may be in a range from about 10 degrees Celsius to about 500 degrees Celsius, and the process pressure may be in a range from about 1 torrs to about 760 torrs. Many variations and/or modifications can be made to embodiments of the disclosure. In some embodiments, the flow rate of ozone is in a range from about 1000 sccm to about 3000 sccm. In some embodiments, the process temperature is in a range from about 50 degrees Celsius to about 300 degrees Celsius. In some embodiments, the process pressure is in a range from about 50 torrs to about 500 torrs. The curing process may transform Si—O bond networks in the flowable dielectric material. As a result, the density of the flowable dielectric material may be increased.

In some embodiments, the formation of the dielectric layer 116 involves an annealing process. The annealing process may include a steam annealing process, a dry annealing process, a plasma annealing process, an ultraviolet (UV) annealing process, an electron beam annealing process, a microwave annealing process, one or more other applicable processes, or a combination thereof.

In some embodiments, organic silane or the like is used as a source gas in the process of forming the dielectric layer 116, such that a substantial amount of carbon coming from the organic silane may be introduced to the dielectric layer 116 to form, for example, Si—C bonds and/or Si—O..C bonds. For example, the organic silane includes tetraethoxysilane, tetramethyldisiloxane, or another suitable carbon-containing silane. The annealing process may include a steam annealing process for replacing some Si—C bonds with Si—OH bonds in the dielectric layer 116. In the steam annealing process, the flow rate of water vapor may be in a range of 5 sccm to 20 sccm, and the process temperature may be in a range of 400 degrees Celsius to 600 degrees Celsius. Subsequently, a dry annealing process may be performed on the dielectric layer 116 in a water-free atmosphere, e.g., in a dry nitrogen atmosphere, to convert the Si—OH bonds into Si—O—Si bonds and to remove moisture from the dielectric layer 116.

Afterwards, the dielectric layer 116 is thinned down until the gate stack 107 is exposed, as shown in FIG. 2G in accordance with some embodiments. In some embodiments, the dielectric layer 116 is thinned down using a planarization process. The planarization process may include a chemical mechanical polishing (CMP) process, a grinding process, an etching process, a dry polishing process, one or more other applicable processes, or a combination thereof.

Figure 2H:
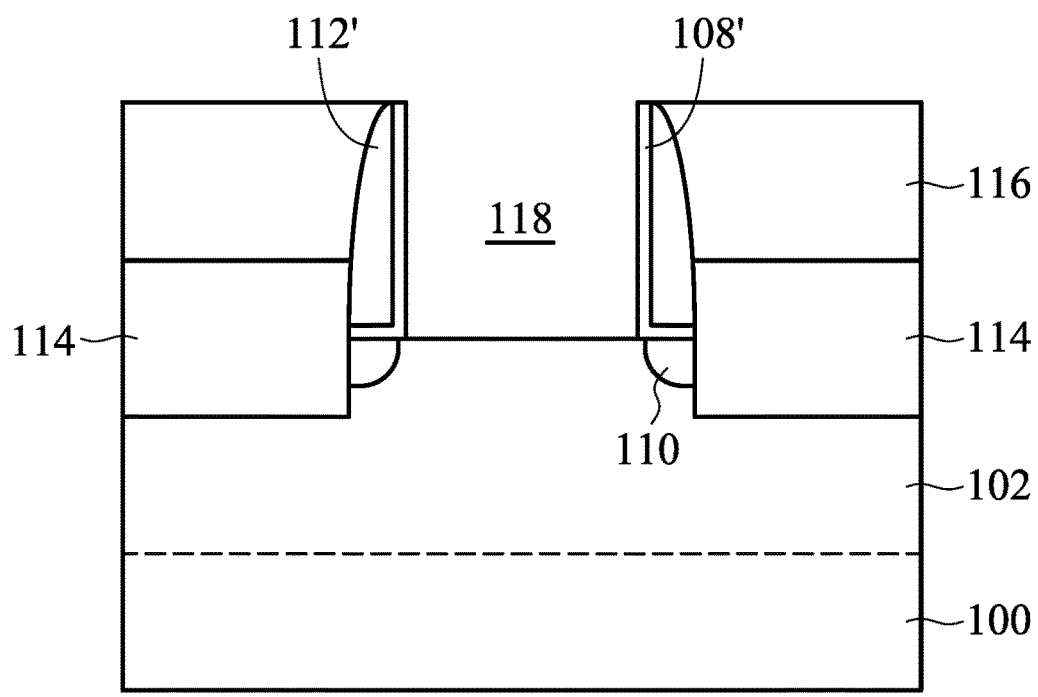

As shown in FIG. 2H, the gate stack 107 is removed to form a trench 118, as shown in FIG. 2H in accordance with some embodiments. The trench 118 exposes a portion of the fin structure 102 that is originally covered by the gate stack 107 (shown in FIG. 2G). The trench 118 may also expose portions of the isolation features 103. In some embodiments, the trench 118 is surrounded by the sealing elements 108', the spacer elements 112', and the dielectric layer 116. In some embodiments, the gate stack 107 is removed using a dry etching process, a wet etching process, one or more other applicable processes, or a combination thereof. In some embodiments, the gate stack 107 is removed using oxygen-containing plasma. The sealing element 108' may have high resistance to the oxygen-containing plasma.

Figure 2I:
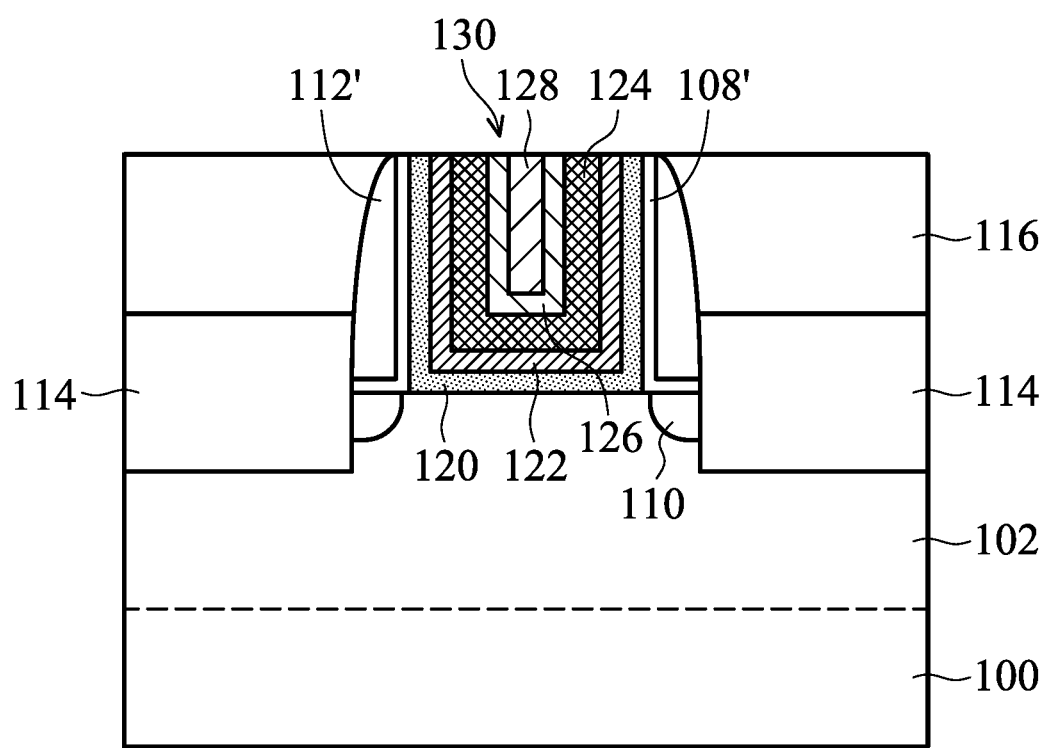

As shown in FIG. 2I, a metal gate stack 130 is formed in the trench 118, in accordance with some embodiments. In some embodiments, metal gate stack layers are formed to overfill the trench 118. The metal gate stack layers may include a gate dielectric layer, a barrier layer, a work function layer, a blocking layer, and/or a metal filling layer.

In some embodiments, a gate dielectric layer 120 is deposited over the sidewalls and bottom of the trench 118, in accordance with some embodiments. In some embodiments, the gate dielectric layer 120 is made of or includes a high-k dielectric layer. The high-k dielectric layer may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 120 is deposited using an ALD process, a CVD process, a spin-on process, one or more other applicable processes, or a combination thereof. In some embodiments, a high temperature annealing operation is used to reduce or eliminate defects in the gate dielectric layer 120.

In some other embodiments, before the gate dielectric layer 120 is formed, an interfacial layer (not shown) is formed in the trench 118. The interfacial layer may be used to reduce stress between the gate dielectric layer 120 and the fin structure 102. In some embodiments, the interfacial layer is made of or includes silicon oxide. In some embodiments, the interfacial layer is formed using an ALD process, a thermal oxidation process, one or more other applicable processes, or a combination thereof.

Afterwards, a barrier layer 122 is deposited over the gate dielectric layer 120, in accordance with some embodiments. The barrier layer 122 may be used to interface the gate dielectric layer 120 with subsequently formed work function layers. The barrier layer 122 may also be used to prevent diffusion between the gate dielectric layer 120 and the subsequently formed work function layers.

In some embodiments, the barrier layer 122 is made of or includes a metal-containing material. The metal-containing material may include titanium nitride, tantalum nitride, one or more other suitable materials, or a combination thereof. In some embodiments, the barrier layer 122 includes multiple sub-layers. The sub-layers may be made of different materials. Alternatively, the sub-layers may be made of the same material. In some embodiments, the barrier layer 122 is deposited using an ALD process, a CVD process, a PVD process, an electroplating process, an electroless plating process, one or more other applicable processes, or a combination thereof. In some other embodiments, the barrier layer 122 is not formed.

Afterwards, a work function layer 124 is formed over the barrier layer 122, in accordance with some embodiments. The work function layer 124 is used to provide desired work function for transistors to enhance device performance including improved threshold voltage. In the embodiments of forming an NMOS transistor, the work function layer can be an n-type metal layer. The n-type metal layer is capable of providing a work function value suitable for the device, such as equal to or less than about 4.5 eV. The n-type metal layer may include metal, metal carbide, metal nitride, or a combination thereof. For example, the n-type metal layer is made of or includes titanium nitride, tantalum, tantalum nitride, one or more other suitable materials, or a combination thereof.

On the other hand, in the embodiments of forming a PMOS transistor, the work function layer can be a p-type metal layer. The p-type metal layer is capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level. For example, a titanium nitride layer may be used as a p-type metal layer or an n-type metal layer, depending on the thickness and/or the compositions of the titanium nitride layer.

Afterwards, a blocking layer 126 is deposited over the work function layer 124, in accordance with some embodiments. The blocking layer 126 may be used to prevent a subsequently formed metal filling layer from diffusing or penetrating into the work function layers. In some embodiments, the blocking layer 126 is made of or includes tantalum nitride, titanium nitride, one or more other suitable materials, or a combination thereof. In some embodiments, the blocking layer 126 is deposited using an ALD process, a CVD process, a PVD process, an electroplating process, an electroless plating process, one or more other applicable processes, or a combination thereof. Embodiments of the disclosure are not limited thereto. In some other embodiments, the blocking layer 126 is not formed.

Afterwards, a metal filling layer 128 is deposited over the blocking layer 126 to fill the trenches 118, in accordance with some embodiments. In some embodiments, the metal filling layer 128 is made of or includes tungsten, aluminum, copper, cobalt, one or more other suitable materials, or a combination thereof. In some embodiments, the metal filling layer 128 is deposited using a PVD process, a CVD process, an electroplating process, an electroless plating process, one or more other applicable processes, or a combination thereof. Many variations and/or modifications can be made to embodiments of the disclosure. In some other embodiments, the metal filling layer 128 is not formed.

In some embodiments, these metal gate stack layers overfill the trench 118 and cover the dielectric layer 116. In some embodiments, the portions of the metal gate stack layers outside of the trench 118 are removed. As a result, a metal gate stack 130 is formed in the trench 118. In some embodiments, a planarization process is used to remove the portions of the metal gate stack layers outside of the trench 118 until the dielectric layer 116 is exposed. The planarization process may include a CMP process, an etching process, a dry polishing process, a grinding process, one or more other applicable processes, or a combination thereof.

Figure 4:
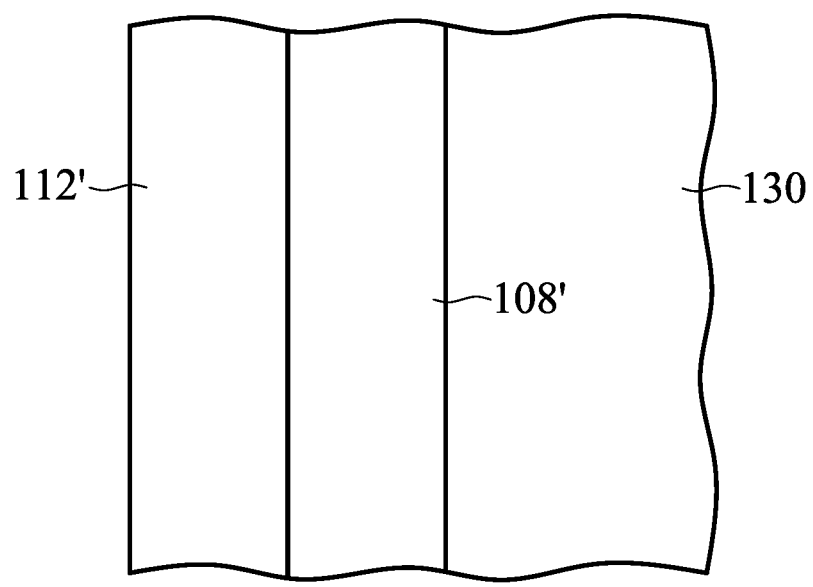
FIG. 4 is a cross-sectional view of a portion of a sealing element or a spacer element of a semiconductor device structure, in accordance with some embodiments.

FIG. 4 is a cross-sectional view of a portion of the sealing element 108' and a spacer element 112' near the metal gate stack 130, in accordance with some embodiments. In some embodiments. FIG. 4 is an enlarged cross-sectional view of the structure shown in FIG. 2I. The sealing element 108' may have a thickness that is in a range from about 2 nm to about 20 nm. The spacer element 112' may have a thickness that is in a range from about 4 nm to about 40 nm. In some embodiments, the method 300 is used to form the sealing element 108' and/or the spacer element 112'. In these cases, the sealing element 108' and/or the spacer element 112' may have a substantially uniform atomic concentration of carbon.

In some embodiments, the sealing element 108' includes atomic layers formed by alternatively and sequentially using the first silicon-containing precursor gas and the second silicon-containing precursor gas. As mentioned above, each of the atomic layers formed using the first silicon-containing precursor gas or the second silicon-containing precursor gas may have a thickness that is in a range from about 2 Å to about 10 Å. In some embodiments, the spacer element 112' have a structure similar to that of the sealing element 108'. The deposition cycle may be repeated more times to form the spacer element 112' with a greater thickness than the sealing element 108'.

Figure 5:
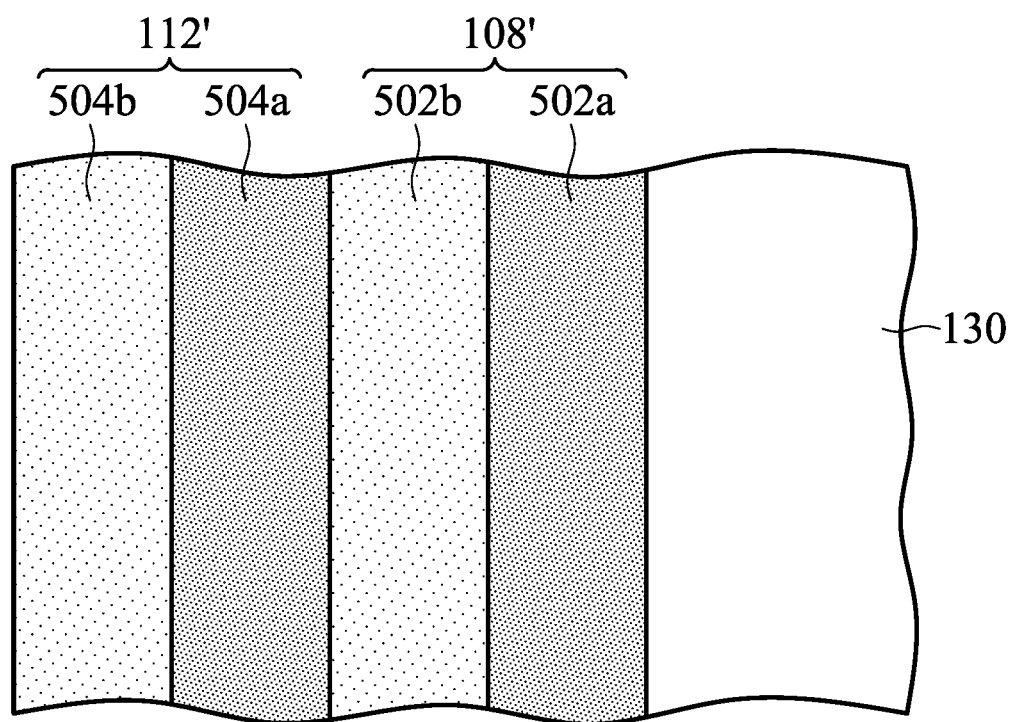
FIG. 5 is a cross-sectional view of a portion of a sealing element or a spacer element of a semiconductor device structure, in accordance with some embodiments.

FIG. 5 is a cross-sectional view of a portion of the sealing element 108' or the spacer element 112' near the metal gate stack 130, in accordance with some embodiments. In some embodiments, the sealing element 108' has a first portion 502a and a second portion 502b. In some embodiments, the first portion 502a is between the second portion 502b and the metal gate stack 130. In some embodiments, the spacer element 112' has a first portion 504a and a second portion 504b. The first portion 504a is between the second portion 504b and the metal gate stack 130.

Figure 8A:
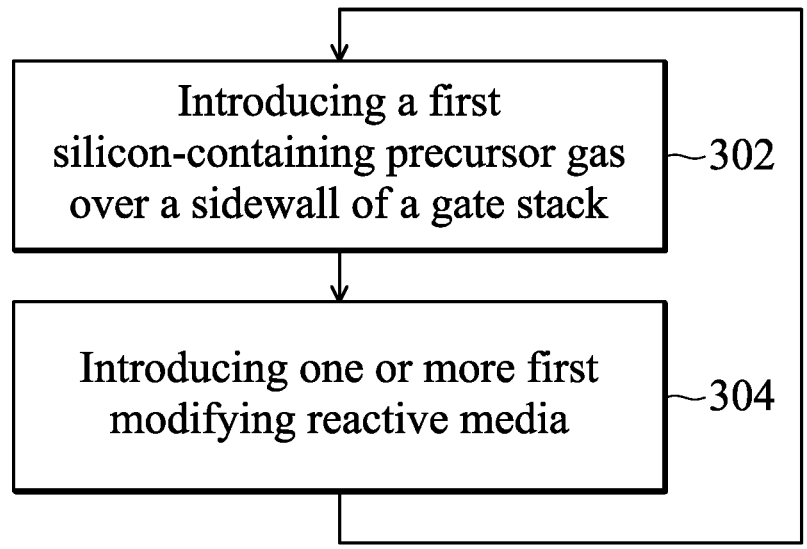
FIG. 8A is a flow chart of a method for forming a material layer using an atomic layer deposition process, in accordance with some embodiments.
Figure 8B:
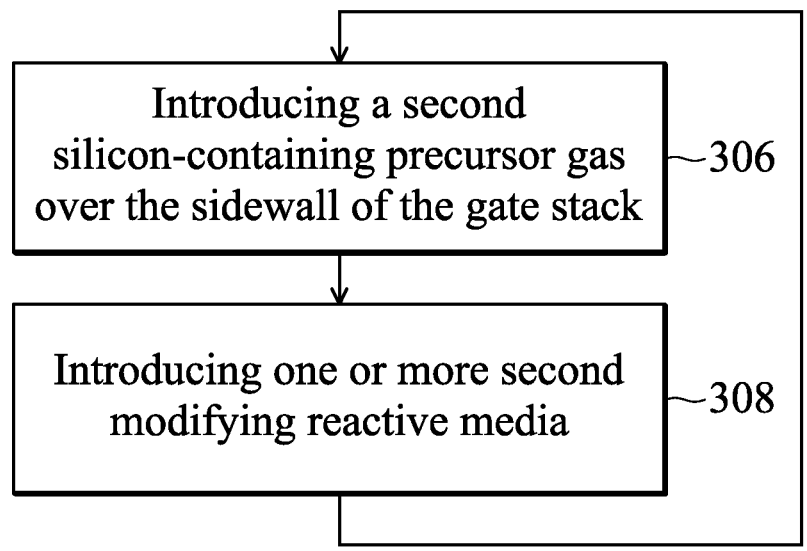
FIG. 8B is a flow chart of a method for forming a material layer using an atomic layer deposition process, in accordance with some embodiments.

In some embodiments, the formation of the first portion 502a of the sealing element 108' or the first portion 504a of the spacer element 112' involves repeatedly introducing the first silicon-containing precursor gas. In some embodiments, the modifying reactive media is introduced between introducing the first silicon-containing precursor gas and introducing the first silicon-containing precursor gas again. The first portion 502a of the sealing element 108' or the first portion 504a of the spacer element 112' includes a stack of multiple atomic layers formed using the first silicon-containing precursor gas. In some embodiments, the interfaces between these atomic layers are not detectable. FIGS. 8A and 8B are flow charts of a method for forming a sealing layer or a spacer layer using an atomic layer deposition process, in accordance with some embodiments. In some embodiments, the operations 302 and 304 are repeated multiple times until the first portion 502a of a desired thickness has been formed, as shown in FIG. 8A.

In some embodiments, the formation of the second portion 502b of the sealing element 108' or the second portion 504b of the spacer element 112' involves repeatedly introducing the second silicon-containing precursor gas. In some embodiments, the modifying reactive media is introduced between introducing the second silicon-containing precursor gas and introducing the second silicon-containing precursor gas again. The second portion 502b of the sealing element 108' or the first portion 504a of the spacer element 112' includes a stack of multiple atomic layers formed using the first silicon-containing precursor gas. In some embodiments, the interfaces between these atomic layers are not detectable. In some embodiments, the operations 306 and 308 are repeated multiple times until the second portion 502a of a desired thickness has been formed, as shown in FIG. 8B.

In some embodiments, the second portion 502b has a different atomic concentration of carbon than that of the first portion 502a. In some embodiments, the second portion 504b has a different atomic concentration of carbon than that of the first portion 504a. In some embodiments, the second portion 502b has a greater atomic concentration of carbon than that of the first portion 502a. In some embodiments, the second portion 504b has a greater atomic concentration of carbon than that of the first portion 504a. In some embodiments, the first portions 502a and 504a are formed using the first silicon-containing precursor gas that is substantially free of carbon. In some embodiments, the first portions 502a and 504a are also substantially free of carbon.

In some other embodiments, the modifying reactive media introduced between introducing the first silicon-containing precursor gas and introducing the first silicon-containing precursor gas again includes carbon. In these cases, the first portions 502a and 504a may also include carbon. The atomic concentration of carbon of the first portion 502a or 504a is smaller than that of the second portion 502b or 504b formed using the second silicon-containing precursor gas including a Si—C bonding. In some embodiments, the ratio of carbon contained in the first portion 502a (or 504a) to carbon contained in the second portion 502b (or 504b) is in a range from about 0.5 to about 0.9.

In some embodiments, the first portion 502a (or 504a) includes atomic layers that are formed using the first silicon-containing precursor gas substantially free of carbon. In some embodiments, the first portion 502a (or 504a) includes no Si—C bonding. The second portion 502b (or 504b) includes atomic layers that are formed using the second silicon-containing precursor gas containing a Si—C bonding. The second portion 502b (or 504b) has a greater atomic concentration of carbon than that of the first portion 502a (or 504a). Due to higher carbon content, the second portion 502b (or 504b) may contribute a lower dielectric constant of the sealing element 108' (or the spacer element 112'). The first portion 502a (or 504a) that includes no Si—C bonding may have better oxidation resistance to the second portion 502b (or 504b). Therefore, the first portion 502a (or 504a) may protect the second portion 502b (or 504b) from being oxidized or damaged during subsequent processes such as the water-involved annealing process for forming the dielectric layer 116 (in FIG. 2G) and the oxygen-containing plasma treatment for removing the gate stack 107 (in FIG. 2H).

Figure 6:
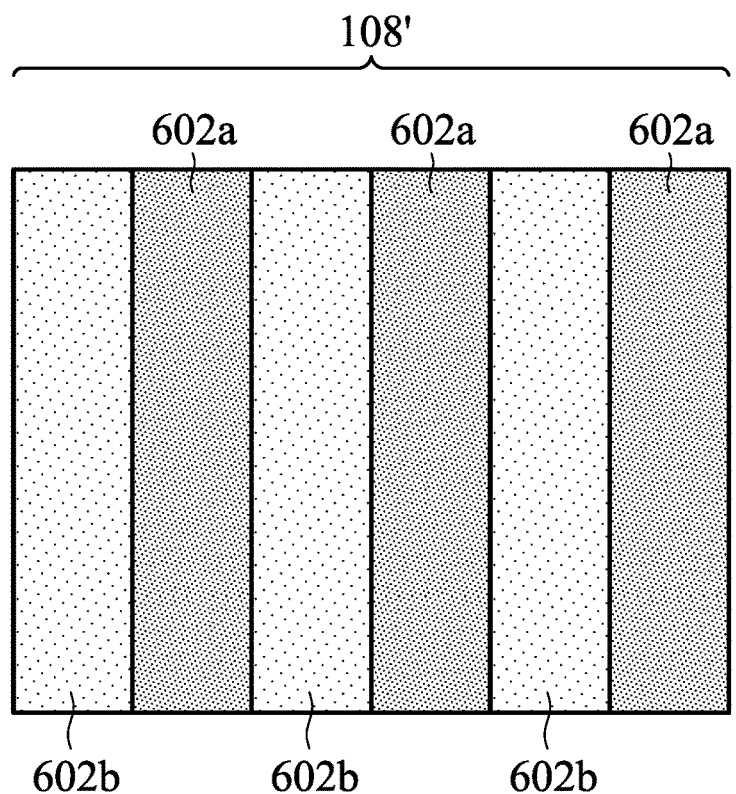
FIG. 6 is a cross-sectional view of a portion of a sealing element of a semiconductor device structure, in accordance with some embodiments.

FIG. 6 is a cross-sectional view of a portion of a sealing element of a semiconductor device structure, in accordance with some embodiments. In some embodiments, the sealing element 108' includes a stack of multiple first portions 602a and multiple second portions 602b. In some embodiments, each of the first portions 602a has a similar or the same composition of the first portion 502a as illustrated in FIG. 5. In some embodiments, each of the second portions 602b has a similar or the same composition of the second portion 502b as illustrated in FIG. 5. In some embodiments, the methods illustrated in FIGS. 8A and 8B may be repeated multiple times to form the structure shown in FIG. 6. In some embodiments, the spacer elements 112' may also have a similar structure as shown in FIG. 6.

Embodiments of the disclosure form a sealing element and/or a spacer element over sidewalls of a gate stack using an atomic layer deposition process. A first silicon-containing precursor gas and a second silicon-containing gas are alternately and sequentially introduced to form a material layer for forming the sealing element or the spacer element. The second silicon-containing precursor gas may have a greater atomic concentration of carbon than that of the first silicon-containing precursor gas. The second silicon-containing precursor gas may allow the material layer to have a low dielectric constant. The first silicon-containing precursor gas may allow the material layer to have high resistance to the subsequent oxygen-involved etching process and/or water-involved annealing process. For example, the second silicon-containing precursor gas includes a silicon-carbon bonding, and the first silicon-containing precursor gas does not include any silicon-carbon bonding. The first silicon-containing precursor gases may be used to provide the sealing layer and/or the spacer layer with the strong oxidation-resistance terminal ligand. The second silicon-containing precursor gas may be used to provide the sealing layer and/or the spacer layer with a carbon-containing bonding (such as a Si—C bonding), which may result in a low dielectric constant. Therefore, a sealing element and/or a spacer element having a low dielectric constant and good oxidation resistance to sustain subsequent processes are obtained. The process feasibility and process window are improved.

In accordance with some embodiments, a method for forming a semiconductor device structure is provided. The method includes forming a gate stack over a semiconductor substrate. The method also includes forming a sealing layer over a sidewall of the gate stack using an atomic layer deposition process. The atomic layer deposition process includes alternately and sequentially introducing a first silicon-containing precursor gas and a second silicon-containing precursor gas over the sidewall of the gate stack to form the sealing layer. The second silicon-containing precursor gas has a different atomic concentration of carbon than that of the first silicon-containing precursor gas. The method further includes partially removing the sealing layer to form a sealing element over the sidewall of the gate stack. In accordance with some embodiments, a method for forming a semiconductor device structure is provided. The method includes forming a gate stack over a semiconductor substrate. The method also includes forming a sealing layer over a sidewall of the gate stack using an atomic layer deposition process. The atomic layer deposition process includes repeatedly introducing a first silicon-containing precursor gas over the sidewall of the gate stack to form a first portion of the sealing layer. The atomic layer deposition process also includes repeatedly introducing a second silicon-containing precursor gas over the sidewall of the gate stack to form a second portion of the sealing layer over the first portion of the sealing layer. The second silicon-containing precursor gas has a different atomic concentration of carbon than that of the first silicon-containing precursor gas. The method further includes partially removing the sealing layer to form a sealing element over the sidewall of the gate stack.

In accordance with some embodiments, a semiconductor device structure is provided. The semiconductor device structure includes a semiconductor substrate and a gate stack over the semiconductor substrate. The semiconductor device structure also includes a sealing element over a sidewall of the gate stack. The sealing element has a first portion and a second portion. The first portion is between the second portion and the sidewall of the gate stack. The second portion has a different atomic concentration of carbon than that of the first portion.

In accordance with some embodiments, a method for forming a semiconductor device structure is provided. The method includes forming a gate stack over a semiconductor substrate. The method also includes forming a sealing layer over a sidewall of the gate stack using an atomic layer deposition process. The atomic layer deposition process includes alternately and sequentially introducing a first silicon-containing precursor gas and a second silicon-containing precursor gas over the sidewall of the gate stack to form the sealing layer. The second silicon-containing precursor gas includes a silicon-carbon bonding, and the first silicon-containing precursor gas does not include any silicon-carbon bonding. The method further includes partially removing the sealing layer to form a sealing element over the sidewall of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a gate stack over a semiconductor substrate;
   forming a sealing layer over a sidewall of the gate stack using an atomic layer deposition process in a process chamber, wherein the atomic layer deposition process comprises:
      alternately and sequentially introducing a first precursor gas and a second precursor gas over the sidewall of the gate stack to form the sealing layer, wherein the second precursor gas has a different atomic concentration of carbon than that of the first precursor gas, and
      removing a reaction byproduct from the process chamber after the first precursor gas is introduced and before the second precursor gas is introduced; and
   partially removing the sealing layer to form a sealing element over the sidewall of the gate stack.

2. The method for forming a semiconductor device structure as claimed in claim 1, wherein the second precursor gas has a greater atomic concentration of carbon than that of the first precursor gas.

3. The method for forming a semiconductor device structure as claimed in claim 1, further comprising:
   introducing at least one first modifying reactive media after introducing the first precursor gas and before introducing the second precursor gas; and
   introducing at least one second modifying reactive media after introducing the second precursor gas and before introducing the first precursor gas again.

4. The method for forming a semiconductor device structure as claimed in claim 3, wherein introducing the at least one first modifying reactive media comprises:
   introducing an oxygen-containing media;
   introducing a nitrogen-containing media; and
   introducing a carbon-containing media.

5. The method for forming a semiconductor device structure as claimed in claim 3, wherein introducing the at least one second modifying reactive media comprises:
   introducing an oxygen-containing media;
   introducing a nitrogen-containing media; and
   introducing a carbon-containing media.

6. The method for forming a semiconductor device structure as claimed in claim 1, wherein the first precursor gas comprises a silicon-halogen bonding, a silicon-nitrogen bonding, a silicon-hydrogen bonding, or a combination thereof.

7. The method for forming a semiconductor device structure as claimed in claim 1, wherein the second precursor gas comprises a silicon-carbon bonding.

8. The method for forming a semiconductor device structure as claimed in claim 7, wherein the second precursor gas further comprises a silicon-halogen bonding, a silicon-nitrogen bonding, a silicon-hydrogen bonding, or a combination thereof.

9. The method for forming a semiconductor device structure as claimed in claim 1, further comprising:
   forming a lightly doped region under the sealing layer;
   forming a spacer layer over the sealing layer; and
   partially removing the spacer layer to form a spacer element over the sealing element.

10. The method for forming a semiconductor device structure as claimed in claim 9, wherein the spacer layer is formed using a second atomic layer deposition process, wherein the second atomic layer deposition process comprises alternately and sequentially introducing a third precursor gas and a fourth precursor gas over the sidewall of the gate stack to form the spacer layer, wherein the fourth precursor gas has a different atomic concentration of carbon than that of the third precursor gas.

11. The method for forming a semiconductor device structure as claimed in claim 10, wherein the first precursor gas and the third precursor gas have the same composition, and the second precursor gas and the fourth precursor gas have the same composition.

12. A method for forming a semiconductor device structure, comprising:
   forming a gate stack over a semiconductor substrate;
   forming a sealing layer over a sidewall of the gate stack using an atomic layer deposition process in a process chamber, wherein the atomic layer deposition process comprises alternately and sequentially introducing a first precursor gas and a second precursor gas over the sidewall of the gate stack to form the sealing layer, wherein the second precursor gas has a different atomic concentration of carbon than that of the first precursor gas;
   forming a lightly doped region under the sealing layer; and
   forming a spacer layer over the sealing layer after the lightly doped region is formed, wherein the spacer layer is formed using a second atomic layer deposition process, wherein the second atomic layer deposition process comprises alternately and sequentially introducing a third precursor gas and a fourth precursor gas over the sidewall of the gate stack to form the spacer layer, wherein the fourth precursor gas has a different atomic concentration of carbon than that of the third precursor gas.

13. The method for forming a semiconductor device structure as claimed in claim 12, wherein the first precursor gas and the third precursor gas have the same composition, and the second precursor gas and the fourth precursor gas have the same composition.

14. The method for forming a semiconductor device structure as claimed in claim 12, further comprising:
   introducing at least one first modifying reactive media after introducing the first precursor gas and before introducing the second precursor gas; and
   introducing at least one second modifying reactive media after introducing the second precursor gas and before introducing the first precursor gas again.

15. The method for forming a semiconductor device structure as claimed in claim 14, further comprising introducing a purge gas into the process chamber after introducing the first precursor gas and before introducing at least one first modifying reactive media.

16. The method for forming a semiconductor device structure as claimed in claim 14, wherein introducing the at least one first modifying reactive media comprises:
   introducing an oxygen-containing media;
   introducing a nitrogen-containing media; and
   introducing a carbon-containing media.

17. The method for forming a semiconductor device structure as claimed in claim 12, wherein the second silicon-containing precursor gas includes a silicon-carbon bonding, and the first silicon-containing precursor gas does not include any silicon-carbon bonding.

18. The method for forming a semiconductor device structure as claimed in claim 12, further comprising partially removing the sealing layer and the spacer layer to form a sealing element and a spacer element over the sidewall of the gate stack.

19. The method for forming a semiconductor device structure as claimed in claim 18, further comprising forming a source/drain structure over the semiconductor substrate after the spacer element is formed, wherein the source/drain structure is in direct contact with the lightly doped region.

20. A semiconductor device structure, comprising:
   a semiconductor substrate;
   a gate stack over the semiconductor substrate; and
   a spacer element over a sidewall of the gate stack, wherein:
      the spacer element has a first portion, a second portion, a third portion, and a fourth portion,
      each of the first portion, the second portion, the third portion, and the fourth portion conformally extends along the sidewall of the gate stack;
      the second portion is sandwiched between the first portion and the third portion,
      the third portion is sandwiched between the second portion and the fourth portion,
      each of the first portion and the third portion has a first atomic concentration of carbon,
      each of the second portion and the fourth portion has a second atomic concentration of carbon, and
      the second atomic concentration of carbon is greater than the first atomic concentration of carbon.

* * * * *